United States Patent [19]

Shinano et al.

[11] Patent Number: 4,744,139
[45] Date of Patent: May 17, 1988

[54] APPARATUS FOR AUTOMATICALLY ADJUSTING THE WORKTABLE OF AN ELECTRONIC COMPONENTS INSERTION MACHINE

[75] Inventors: Keizo Shinano, Kodaira; Yoshinobu Inoue, Hachioji, both of Japan

[73] Assignee: Citizen Watch Company, Ltd., Tokyo, Japan

[21] Appl. No.: 829,502

[22] Filed: Feb. 14, 1986

[30] Foreign Application Priority Data

Feb. 15, 1985 [JP] Japan ............................... 60-19035[U]

[51] Int. Cl.⁴ ................................................ H05K 3/30
[52] U.S. Cl. ........................................ 29/741; 29/739; 29/740; 29/759
[58] Field of Search .................................. 29/739–741, 29/759

[56] References Cited

U.S. PATENT DOCUMENTS 4,291,867 9/1981 Williams et al. .................. 29/760 X
4,399,988 8/1983 De Shong ......................... 29/739 X
4,649,635 3/1987 Asai et al. ......................... 29/741 X Primary Examiner—P. W. Echols
Assistant Examiner—Taylor J. Ross
Attorney, Agent, or Firm—Finnegan, Henderson, Farabow, Garrett & Dunner

[57] ABSTRACT

An apparatus for automatically fixing a printed circuit board to a predetermined position on a worktable of an automatic electronic components insertion machine having a non-shiftably arranged reference positioning pin and a shiftable positioning pin which is automatically shifted by an automatic shifting unit, including a numerically controlled rotary drive unit and a feed screw mechanism. The shiftable positioning pin is arranged so as to be always shifted from a predetermined origin position toward or away from the reference positioning pin in response to a change in the size of printed circuit boards to be fed onto the worktable.

7 Claims, 2 Drawing Sheets

APPARATUS FOR AUTOMATICALLY ADJUSTING THE WORKTABLE OF AN ELECTRONIC COMPONENTS INSERTION MACHINE

BACKGROUND OF THE INVENTION

1. Field of the Invention

The present invention relates to an apparatus for fixing a printed circuit board on a worktable of an automatic electronic components insertion machine by positioning pins. More particularly, the present invention relates to an apparatus for fixing a printed circuit board to a predetermined position on a worktable of an electronic components insertion machine by automatically changing the relative position of the positioning pins in response to a change in the size of the printed circuit boards fed onto the worktable.

2. Description of the Related Art

Diverse automatic electronic components insertion machines are conventionally used for automatically planting and fixing electronic components on a printed circuit board which is fed or supplied automatically onto a worktable of the insertion machine. The automatic electronic components insertion machine is provided with an insertion head by which leads of electronic parts or components are successively inserted in or assembled on a printed circuit board automatically supplied onto the worktable capable of moving in two mutually orthogonal directions in a horizontal plane and rotating about a vertical axis so as to position mounting holes of the printed circuit board in alignment with the axis of the insertion head. The insertion head inserts leads of each electronic part or component from above the printed circuit board into the corresponding mounting holes of the printed circuit board. Therefore, the worktable is always provided with a pair of positioning pins for fixing a printed circuit board to a predetermined position on the worktable when the printed circuit board is automatically fed onto the worktable. However, the conventional automatic electronic components insertion machines are designed and constructed in such a manner that a number of printed circuit boards having an identical size are continuously processed in the mass production style. That is, there are no frequent changes in the size of the printed circuit board. Accordingly, there is no need for a means for automatically changing the relative position between the pair of positioning pins for fixing a printed circuit board. When printed circuit boards having a different size are to be processed by the insertion machine, the relative position between the pair of positioning pins is manually changed so as to fit the change in the size of the printed circuit boards.

On the other hand, in recent electronic microcomputers, electronic business machines, and electric household appliances, large numbers of electronic units incorporating therein printed circuit board assemblies are employed. Therefore, assembling of the printed circuit boards, including automatic insertion of electronic parts or components into a printed circuit board must be carried out by a flexible manufacturing system. Thus, in the automatic electronic components insertion machine, there is a strong demand for an improvement in the fixing of the printed circuit board on the worktable by the use of the pair of positioning pins; namely, the relative position of the positioning pins can be automatically changed in response to a change in the size of the printed circuit boards without necessitating a manual operation by the operators.

SUMMARY OF THE INVENTION

An object of the present invention is to provide an apparatus for automatically fixing a printed circuit board onto a worktable of an automatic electronic components insertion machine, capable of automatically changing a relative position of or a spacing between a pair of positioning pins for fixing the printed circuit board to a predetermined position on the mounting surface of the worktable in response to a change in the size of the printed circuit boards to be fed onto the worktable.

In accordance with the present invention, there is provided an apparatus for automatically fixing a printed circuit board to a predetermined position on a worktable disposed in association with an inserting head of an electronic components insertion machine, which comprises a reference positioning pin unit to be fixed in a first reference hole formed at one end of a printed circuit board fed on the worktable;

a shiftable positioning pin unit to be fixed in a second reference hole formed at the other end of the printed circuit board;

a unit for actuating both the reference and shiftable positioning pin units so as to be fixed in and released from the reference holes; and a unit for automatically shifting the shiftable positioning pin units toward and away from the reference positioning pin unit in response to a change in a size of the printed circuit board prior to the feeding thereof onto the worktable.

DESCRIPTION OF THE PREFERRED EMBODIMENT

Figure 1:
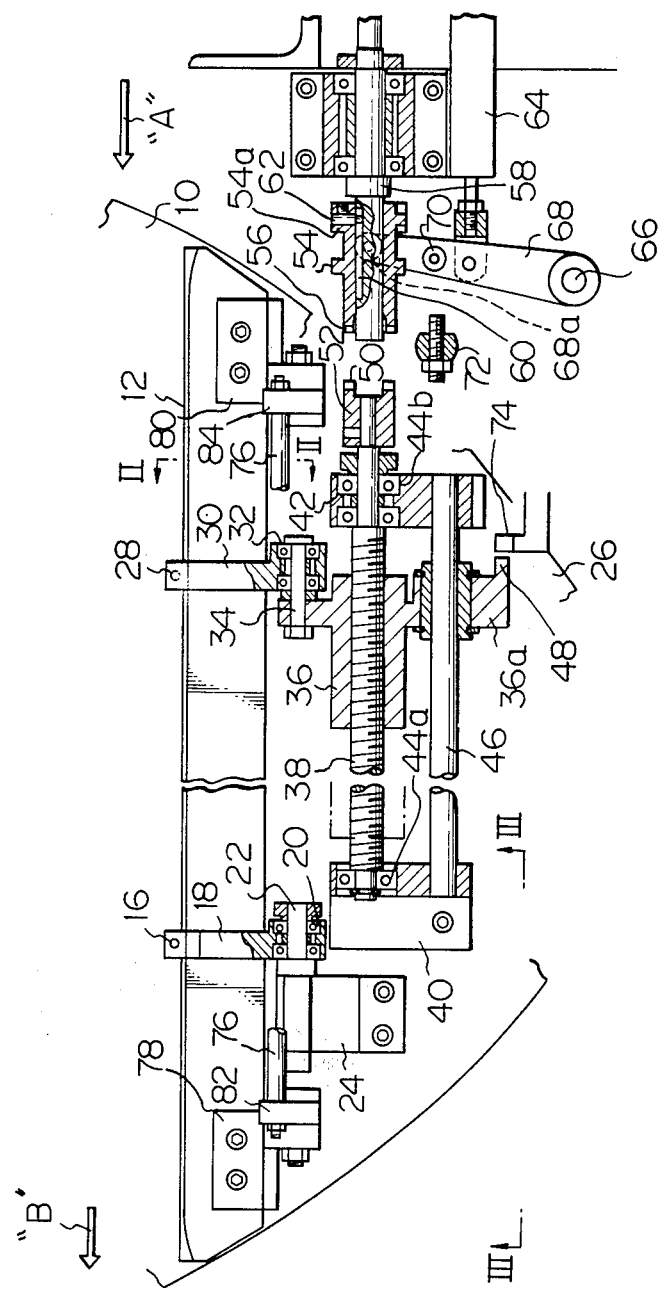
FIG. 1 is a partial plan view of an apparatus for automatically fixing a printed circuit board, according to the present invention, illustrating a state where the apparatus is provided for a worktable of an automatic electronic components insertion machine.
Figure 2:
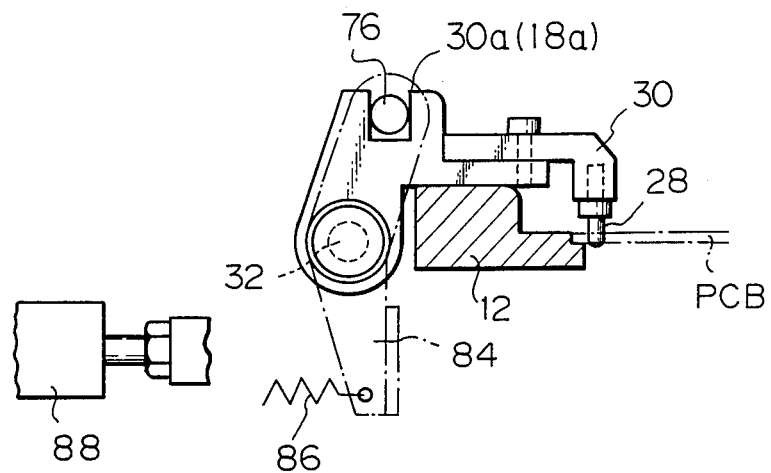
FIG. 2 is a cross-sectional view taken along the line II—II of FIG. 1.
Figure 3:
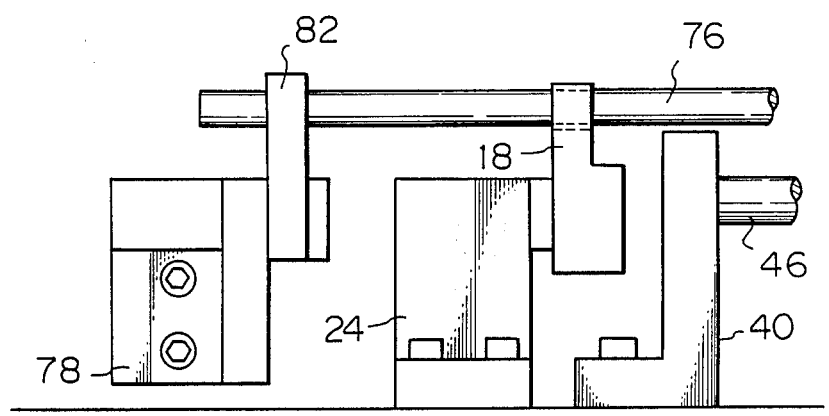
FIG. 3 is a partial side elevational view taken from the arrow line III—III of FIG. 1.

Referring to FIGS. 1 through 3, there is illustrated a worktable 10 arranged below an insertion head (not shown in FIGS. 1 through 3) of an automatic electronic components insertion machine. The worktable 10 onto which a printed circuit board is fed from a direction of an arrow "A" is movable in two mutually orthogonal directions within a horizontal plane i.e., to the right and left and front and backward in FIG. 1, and rotatable about a vertical axis thereof so that any desired mounting holes of the printed circuit board are positioned underneath the insertion head of the insertion machine. When the insertion of all necessary electronic parts and components is completed by the insertion head, the printed circuit board is delivered from the worktable to a next processing stage of assembly in the direction of an arrow "B". Therefore, the worktable 10 has a work-supply port at the right end thereof in FIG. 1 and a work-delivery port at the left end thereof in FIG. 1. The worktable 10 is provided with a lateral guide 12 for accurately guiding the feeding and delivery of a printed circuit board. The guide 12 together with another identical guide not shown in FIGS. 1 through 3 and disposed on the opposite side of the worktable 10 is arranged in such a manner that when the printed circuit board moves onto and off of the worktable, both sides of the printed circuit board slide under the guidance of the two guides while always heading in the correct direction and maintaining a proper posture of the printed circuit board. Accordingly, the printed circuit board will always arrive at a predetermined mounting position suited for the automatic insertion therein of electronic parts and components by the above-mentioned insertion head. At an end of the worktable, i.e., at the work delivery end of the worktable 10 of the present embodiment, there is provided a reference positioning pin 16 held by a support arm 18. That is, the support arm 18 is extended toward an inside of the lateral guide 12 and has a projecting end to which the reference positioning pin 16 is attached. The opposite rear end of the support arm 18 is rotatably mounted on a horizontal pivot 22 by means of a rotary bearing 20. The horizontal pivot 22 is fixedly mounted on a bracket 24 which is attached to the worktable 10 at a position adjacent to the work-delivery port and outside the lateral guide 12. On the side of the work-supply port of the worktable, there is provided a shiftable positioning pin 28 capable of being shifted toward and away from the reference positioning pin 16. The shiftable positioning pin 28 is held by a support arm 30 similar to the above-mentioned support arm 18. The support arm 30 is rotatably mounted, via a rotary bearing 32, on a horizontal pivot 34 which is attached to a shiftably arranged bracket 36 meshed with a ball screw shaft 38. The ball screw shaft 38 is rotatably held by a support 40 arranged on the work delivery side and at a fixed position adjacent to the reference positioning pin 16, and also held by another support 42 arranged on the work supply port side of the worktable 10 by means of rotary bearings 44a and 44b, respectively. It should be understood that the ball screw shaft 38 is disposed in such a manner that the axis of the ball screw shaft 38 extends in parallel with the direction in which the printed circuit board is supplied onto and delivered from the worktable 10, that is, in parallel with the lateral guide 12. A guide rod 46 is arranged between the above-mentioned supports 40 and 42 so as to be extended in parallel with the axis of the ball screw shaft 38. On the guide rod 46 is slidably mounted a lug 36a formed at an end of the shiftable bracket 36 and having a later described dog 48 in the form of a lateral projection.

The support arms 18 and 30 are formed with engagement recesses 18a and 30a (the recess 18a is not shown), respectively, as shown in FIG. 2, and in these recesses 18a and 30a a rod 76 is commonly engaged. Both ends of the rod 76 are fixed to levers 82 and 84 which are rotatably mounted on corresponding fixed brackets 78 and 80. The lever 84 arranged on the work supply port side is projected downward and has a lower end to which one end of a spring 86 is fixed. The spring 86 applies a spring force to the lever 84 so that the lever 84 is urged to a state where the rod 76 presses against the support arms 18 and 30 and fixes the reference and shiftable positioning pins 16 and 28 in corresponding reference holes formed beforehand in a printed circuit board supplied onto the worktable 10. A cylinder or a solenoid plunger 88, is provided for rotating the lever 84 in the counterclockwise direction against the spring 86 thereby releasing the reference and shiftable positioning pins 16 and 28 from the reference holes of the printed circuit board via the rod 76. The above-mentioned fixing and releasing operations of the reference and shiftable positioning pins 16 and 18 are carried out when the worktable 10 is located at a position suitable for receiving and delivering a printed circuit board.

The ball screw shaft 38 has one end projecting toward the work supply end of the worktable 10 through the support 42. To the projecting end of the ball screw shaft 38 is fixed a coupling element 52 having clutch teeth 50 which are mechanically engageable with associated clutch teeth 56 of an axially movable coupling element 54. The axially movable coupling element 54 arranged coaxially with the ball screw shaft 38 is mounted on a rotary input shaft 58 attached to an end of an output shaft of a rotary drive source consisting of, e.g. a numerically controlled motor (not illustrated in FIG. 1) such as a D.C. motor or a stepping motor, in such a manner that a radial key 62 fixed to a part of the coupling element 54 is projected into a keyway 60 axially formed in the outer surface of the rotary input shaft 58. Thus, the coupling element 54 is axially movable relative to the rotary input shaft 58 and rotatable with the rotary input shaft 58. Accordingly, when the axially movable coupling element 54 is moved toward the coupling element 52 with respect to the rotary input shaft 58, the clutch teeth 56 are mechanically engaged with the clutch teeth 50 of the coupling element 52. As a result, the rotation of the rotary drive source is transmitted to the ball screw shaft 38. Therefore, in response to the rotation of the ball screw shaft 38, the shiftable bracket 36 engaged with the ball screw shaft 38 is moved back and forth along the axis of the ball screw shaft 38, so that the shiftable positioning pin 28 is moved relatively toward and away from the reference positioning pin 16. At this stage, it should be understood that the forward and backward movement of the axially movable coupling element 54 relative to the rotary input shaft 58 is caused by the operation of a cylinder 64. That is, when the cylinder 64 operates so as to swing a lever 68 about a pivot 66, an outer end 68a engaged in a recess 54a of the coupling element 54 urges the element 54 to move axially. The movement of the axially movable coupling element 54 toward the ball screw shaft 38 is permitted until a stop 70 provided on the lever 68 abuts against a fixedly arranged stop 72. The position of the fixedly arranged stop 72 is adjusted so that, when the stop 70 is brought into contact with the stop 72, the clutch teeth 56 of the coupling element 54 come into exact engagement with the clutch teeth 50 of the coupling 52 attached to the ball screw shaft 38.

A detecting device 74 is arranged outside the worktable 10 and at a position near the work supply port of the worktable 10. The detecting device 74 is provided for detecting the dog 48 of the shiftable bracket 36. That is, when the dog 48 is adjacent to and is detected by the detecting device 74, the shiftable positioning pin 28 is set at a predetermined origin position. Although not shown in the Figures, the detecting device 74 is constructed so as to be capable of being moved from a position at which it detects the dog 48 toward a retracted position where the detecting end of the detecting device 74 does not obstruct the rotation of the worktable 10. The detecting device 74 may be a conventional photo sensor or an electro-magnetic sensor, and cooperates with the dog 48 so as to construct an origin point detecting unit for detecting a point of origin of the shiftable positioning pin 28.

In accordance with the above-described arrangement, the axially movable coupling element 54, the rotary drive source, the cylinder 64, and the fixedly arranged stop 72 are provided outside the worktable 10. Thus, when the axially movable coupling element 54 is coupled with the coupling element 52 of the worktable by the operation of the cylinder 64 and the lever 68, the rotation of the rotary drive source is transmitted to the ball screw shaft 38. As a result, as previously mentioned, the shiftable positioning pin 28 can be moved toward and away from the reference positioning pin 16 so that a spacing between the two positioning pins 16 and 28 may be adjusted. It should thus be understood that the numerically controlled rotary drive source, the two associated coupling elements 52 and 54 constructing a mechanical clutch unit, the ball screw shaft 38, and the shiftable bracket 36 having a screw thread formed therein and engaged with the ball screw shaft 38 construct an automatic shifting unit for the shiftable positioning pin 28. The automatic shifting unit is, therefore, able to shift the shiftable positioning pin 28 from the origin position toward the reference positioning pin 16 by any desired amount of movement. In other words, when, for example, a stepping motor constructing the rotary drive source is operated so as to rotate the ball screw shaft 38 by a predetermined number of revolutions with respect to the state where the shiftable positioning pin 28 is located at the point of origin thereof, the shiftable positioning pin 28 can be shifted, from the point of origin of the pin 28, a predetermined amount of movement corresponding to the predetermined number of revolutions of the ball screw shaft 38. Consequently, by the use of the above-mentioned automatic shifting unit, it is possible to automatically shift the shiftable positioning pin 28 relative to the non-shiftable reference positioning pin 16 in response to a change in a spacing of the reference holes of a printed circuit board when the size of printed circuit boards to be supplied onto the worktable 10 of the automatic electronic components insertion machine is changed. Accordingly, it is possible to position and fix various printed circuit boards having different sizes onto the worktable 10.

From the foregoing description of the preferred embodiment of the present invention, it will be understood that, according to the present invention, the apparatus for automatically fixing a printed circuit board to a predetermined position on the mounting surface of the work table of an automatic electronic components insertion machine is easily and automatically able to meet any change in the size of a printed circuit board during the automatic inserting and assembling operation of the insertion machine. Thus, it will be understood that by the use of the automatic fixing apparatus according to the present invention, mass production of the printed circuit board assemblies can be realized by a so-called flexible manufacturing system. It should be further understood that since the unit for actuating the shiftable positioning pin, including a numerically controlled rotary drive source and so on, is arranged outside the worktable, the worktable can be light in weight and can be moved at a high speed.

We claim:

1. An apparatus for automatically fixing a printed circuit board by use of positioning pins to a predetermined position on a movable worktable disposed in association with an insertion head of an electronic components insertion machine, comprising:

reference positioning pin means to be fixed in a first reference hole formed at one end of a printed circuit board fed onto said worktable;

shiftable positioning pin means to be fixed in a second reference hole formed at the other end of said printed circuit board;

means for actuating both said reference and said shiftable positioning pin means so as to be fixed in and released from said reference holes; and means for automatically shifting said shiftable positioning pin means toward and away from said reference positioning pin means in response to a change in a size of said printed circuit board prior to feeding thereof onto said worktable, said automatic shifting means comprising origin point detecting means for detecting a point of origin of said shiftable positioning pin means, said origin point detecting means comprising a dog provided on an end of said shiftable positioning pin means and a dog detecting device fixedly arranged outside of said worktable and producing a signal of the point of origin in response to a contact with said dog, a feed screw means meshed with said shiftable positioning pin means and rotated under numerical control for controlling a shifting movement of said shiftable positioning pin means and a guide means arranged in parallel with said feed screw means for guiding a shifting movement of said shiftable positioning pin means.

2. An apparatus for automatically fixing a printed circuit board by use of positioning pins to a predetermined position on a movable worktable disposed in association with an insertion head of an electronic components insertion machine, comprising:

reference positioning pin means to be fixed in a first reference hole formed at one end of a printed circuit board fed onto said worktable;

shiftable positioning pin means to be fixed in a second reference hole formed at the other end of said printed circuit board;

means for actuating both said reference and said shiftable positioning pin means so as to be fixed in and released from said reference holes; and means for automatically shifting said shiftable positioning pin means toward and away from said reference positioning pin means in response to a change in a size of said printed circuit board prior to feeding thereof onto said worktable, said automatic shifting means comprising origin point detecting means for detecting a point of origin of said shiftable positioning pin means, a feed screw means meshed with said shiftable positioning pin means and rotated under numerical control for controlling a shifting movement of said shiftable positioning pin means, said feed screw means comprising a threaded screw member rotatably mounted on said worktable and having at an end thereof a mechanical coupling portion capable of being engaged with a numerically controlled drive source when said worktable is positioned at a predetermined position under said insertion head, an a guide means arranged in parallel with said screw member for guiding a shifting movement of said shiftable positioning pin means.

3. An apparatus for fixing a printed circuit board, according to claim 2, wherein said origin point detecting means comprise a dog provided on an end of said shiftable positioning means and a dog detecting device fixedly arranged outside of said worktable and producing a signal of the point of origin in response to a contact with said dog.

4. An apparatus for automatically fixing a printed circuit board by use of positioning pins to a predetermined position on a movable worktable disposed in association with an insertion head of an electronic components insertion machine, comprising:

reference positioning pin means to be fixed in a first reference hole formed at one end of a printed circuit board fed onto said worktable;

shiftable positioning pin means to be fixed in a second reference hole formed at the other end of said printed circuit board;

said reference positioning pin means and said shiftable positioning pin means being rotatably mounted on a horizontal pivot and arranged on said worktable so as to be spaced apart from one another in a direction along which said printed circuit board is fed onto and delivered from said worktable;

means for actuating both said reference and said shiftable positioning pin means so as to be fixed in and released from said reference holes of said printed circuit board on said worktable; and means for automatically shifting said shiftable positioning pin means toward and away from said reference positioning pin means in response to a change in a size of said printed circuit board prior to feeding thereof onto said worktable.

5. An apparatus for fixing a printed circuit board, according to claim 4, wherein said reference positioning pin means is arranged at a fixed position adjacent to a work delivery end of said worktable and, wherein said shiftable positioning pin means is arranged at a position adjacent to a work supply end of said worktable and is shiftable toward and away from said reference pin means.

6. An apparatus for fixing a printed circuit board, according to claim 4, wherein said reference positioning pin means comprise a reference pin, a support arm supporting thereon said reference pin and rotatably mounted on said associated horizontal pivot and a fixed bracket member to which said associated horizontal pivot is fixedly attached, and wherein said shiftable positioning pin means comprise a shiftable pin, a support arm supporting thereon said shiftable pin and rotatably mounted on said associated horizontal pivot and a shiftable bracket to which said associated horizontal pivot is fixedly attached.

7. An apparatus for fixing a printed circuit board, according to claim 4, wherein said means for actuating both said reference and said shiftable positioning pin means comprise a pair of rotatable lever means having an extended rod arranged between said pair of rotatable lever means and engaged with said reference and said shiftable positioning pin means, a spring means for applying a biasing force to said lever means thereby urging said reference and said shiftable positioning pin means toward engagement positions with said first and said second reference holes of said printed circuit board by way of said extended rod; and a cylinder means for rotating said lever means against said spring means.

* * * * *